(12) United States Patent
Le et al.

(10) Patent No.: US 12,433,140 B2
(45) Date of Patent: Sep. 30, 2025

(54) DISPLAY AND DISPLAY SYSTEM

(71) Applicant: 3M INNOVATIVE PROPERTIES COMPANY, St. Paul, MN (US)

(72) Inventors: John D. Le, Woodbury, MN (US); Gilles J. Benoit, Minneapolis, MN (US); Adam D. Haag, Woodbury, MN (US); David J. W. Aastuen, Shoreview, MN (US); Lin Zhao, Woodbury, MN (US); Michael L. Steiner, New Richmond, WI (US); Timothy L. Wong, West St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 19/004,811

(22) PCT Filed: Jul. 13, 2023

(86) PCT No.: PCT/IB2023/057200
§ 371 (c)(1),
(2) Date: Dec. 30, 2024

(87) PCT Pub. No.: WO2024/018339
PCT Pub. Date: Jan. 25, 2024

(65) Prior Publication Data
US 2025/0261547 A1 Aug. 14, 2025

Related U.S. Application Data

(60) Provisional application No. 63/391,040, filed on Jul. 21, 2022.

(51) Int. Cl.
*H10K 59/80* (2023.01)
*H10K 59/35* (2023.01)

(52) U.S. Cl.
CPC ......... *H10K 59/8791* (2023.02); *H10K 59/35* (2023.02)

(58) Field of Classification Search
CPC ........................ H10K 59/8791; H10K 59/35
See application file for complete search history.

(56) References Cited

U.S. PATENT DOCUMENTS

| 2011/0193814 A1 | 8/2011 | Gay et al. |
| 2016/0161650 A1 | 6/2016 | Taraschi et al. |

(Continued)

FOREIGN PATENT DOCUMENTS

| CN | 110531526 A | 12/2019 |
| CN | 111948813 A | 11/2020 |

(Continued)

OTHER PUBLICATIONS

Gou, "Angular Color Shift of Micro-LED Displays", Optics Express A, 2019, vol. 27, No. 12, pp. 746-757.

(Continued)

*Primary Examiner* — Kevin Quarterman
(74) *Attorney, Agent, or Firm* — Clifton F. Richardson

(57) ABSTRACT

A display includes a plurality of blue, green, and red light emitting elements having respective blue, green, and red emission spectra including respective blue, green, and red emission peaks at respective blue, green, and red peak wavelengths with respective blue, green, and red full width at half maxima (FWHMs). The display includes a display panel and an optically collimating film. For a substantially collimated incident light and for each of mutually orthogonal polarization states, an optical transmittance of the optically collimating film includes substantially distinct blue, green, and red transmission bands having respective blue, green, and red FWHMs that overlap at least 30% of the respective blue, green, and red FWHMs at a first incident (Continued)

angle of less than about 10 degrees and overlap less than 15% of the respective blue, green, and red FWHMs at a second incident angle of greater than about 30 degrees.

15 Claims, 6 Drawing Sheets

(56)  References Cited

U.S. PATENT DOCUMENTS

| | | | |
|---|---|---|---|
| 2017/0309843 A1* | 10/2017 | Kim | ............................ B32B 3/30 |
| 2018/0150671 A1* | 5/2018 | Choo | ...................... H10K 59/40 |
| 2019/0049733 A1 | 2/2019 | Jiang et al. | |
| 2019/0348469 A1* | 11/2019 | Large | ................. H10K 59/8791 |
| 2021/0223568 A1 | 7/2021 | Makinen et al. | |
| 2022/0299692 A1* | 9/2022 | Xu | .......................... H10K 59/35 |

FOREIGN PATENT DOCUMENTS

| | | | |
|---|---|---|---|
| JP | 2014202835 A | 10/2014 |
| JP | 2015194549 A | 11/2015 |

OTHER PUBLICATIONS

He, "Design and Simulation of Low Circadian Action Micro-LED Displays with Four Primary Colors", Crystals, 2020, vol. 10, pp. 383/1-383/10.
International Search report for PCT International Application No. PCT/IB2023/057200, mailed on Oct. 10, 2023, 4 Pages.

* cited by examiner

DISPLAY AND DISPLAY SYSTEM

CROSS REFERENCE TO RELATED APPLICATIONS

This application is a national stage filing under 35 U.S.C. 371 of PCT/IB2023/057200, filed Jul. 13, 2023, which claims the benefit of U.S. Application No. 63/391,040, filed Jul. 21, 2022, the disclosures of which are incorporated by reference in their entireties herein.

TECHNICAL FIELD

The present disclosure relates, in general, to displays and display systems. More particularly, the present disclosure relates to an optically collimating film for the displays and the display systems.

BACKGROUND

Devices, such as, virtual reality (VR) devices and augmented reality (AR) devices, may be used in various applications, such as entertainment, industrial applications, gaming, healthcare, etc. A collimating light control system may be desirable for such devices. Specifically, it may be desirable for such devices to have the collimated light control system for minimizing stray lights and ghost images, as well as to improve an optical performance of such devices.

SUMMARY

In a first aspect, the present disclosure provides a display. The display includes a plurality of blue, green, and red light emitting elements having respective blue, green, and red emission spectra including respective blue, green, and red emission peaks at respective blue, green, and red peak wavelengths with respective blue, green, and red full width at half maxima (FWHMs). The display further includes a display panel disposed on the plurality of blue, green, and red light emitting elements and configured to receive light emitted by the plurality of blue, green, and red light emitting elements and form an image. The display panel is configured to display a virtual image of the formed image to a viewer. The display further includes an optically collimating film disposed between, and substantially co-extensive in length and width with, the display panel and the plurality of blue, green, and red light emitting elements. The optically collimating film includes a plurality of microlayers numbering at least 10 in total. Each of the microlayers has an average thickness of less than about 500 nanometers (nm), such that for a substantially collimated incident light and for each of mutually orthogonal polarization states, an optical transmittance of the optically collimating film includes substantially distinct blue, green, and red transmission bands having respective blue, green, and red FWHMs that overlap at least 30% of the respective blue, green, and red FWHMs of the emission spectra at a first incident angle of less than about 10 degrees and overlap less than 15% of the respective blue, green, and red FWHMs of the emission spectra at a second incident angle of greater than about 30 degrees.

In a second aspect, the present disclosure provides a display for displaying a magnified virtual image of an image formed by a display panel to a viewer. The display includes a plurality of blue, green, and red light emitting elements configured to emit light at least mostly within respective 420-480 nm, 490-560 nm, and 590-670 nm wavelength ranges. The display further includes a display panel configured to receive light emitted by the plurality of blue, green, and red light emitting elements and form the image. The display further includes a lens assembly configured to form the magnified virtual image of the image formed by the display panel. The lens assembly includes at least one lens including at least one curved major surface, a partial reflector, and a reflective polarizer. The display further includes an optically collimating film. For a substantially collimated incident light, a first incident angle of less than about 10 degrees, a second incident angle of greater than about 30 degrees, a blue wavelength within 420-480 nm, a green wavelength within 490-560 nm, and a red wavelength within 590-670 nm, for each of the first and second incident angles, and for each of the blue, green, and red wavelengths, the reflective polarizer reflects at least 60% of the incident light polarized along a first in-plane direction and transmits at least 60% of the incident light polarized along an orthogonal second in-plane direction. For the substantially collimated incident light, the first incident angle, the second incident angle, the blue wavelength, the green wavelength, and the red wavelength, for each of the first and second incident angles, for each of the blue, green, and red wavelengths, and for each of the first and second in-plane directions, the partial reflector reflects at least 30% of the incident light and transmits at least 30% of the incident light. Further, for the substantially collimated incident light, the first incident angle, the second incident angle, the blue wavelength, the green wavelength, and the red wavelength, for each of the blue, green, and red wavelengths, and for each of the first and second in-plane directions, the optically collimating film transmits at least 50% of the incident light for the first incident angle, and transmits less than about 10% of the incident light for the second incident angle.

In a third aspect, the present disclosure provides a display system for displaying a magnified virtual image of an image formed by a pixelated display to a viewer. The display system includes a pixelated display configured to form the image and including a plurality of blue, green, and red light emitting pixels configured to emit light at least mostly within respective 420-480 nm, 490-560 nm, and 590-670 nm wavelength ranges. The display system further includes a lens assembly configured to form the magnified virtual image of the image formed by the pixelated display. The lens assembly includes at least one lens including at least one curved major surface, a partial reflector, and a reflective polarizer. The display system further includes an optically collimating film disposed between the lens assembly and the pixelated display. For a substantially collimated incident light, a first incident angle of less than about 10 degrees, a second incident angle of greater than about 30 degrees, a blue wavelength within 420-480 nm, a green wavelength within 490-560 nm, and a red wavelength within 590-670 nm, for each of the first and second incident angles, and for each of the blue, green, and red wavelengths, the reflective polarizer reflects at least 60% of the incident light polarized along a first in-plane direction and transmits at least 60% of the incident light polarized along an orthogonal second in-plane direction. For the substantially collimated incident light, the first incident angle, the second incident angle, the blue wavelength, the green wavelength, and the red wavelength, for each of the first and second incident angles, for each of the blue, green, and red wavelengths, and for each of the first and second in-plane directions, the partial reflector reflects at least 30% of the incident light and transmits at least 30% of the incident light. For the substantially collimated incident light, the first incident angle, the second incident angle, the blue wavelength, the green wavelength, and the red wavelength, for each of the blue, green and red wavelengths, and for each of the first and second in-plane directions, the optically collimating film transmits at least 50% of the incident light for the first incident angle, and transmits less than about 10% of the incident light for the second incident angle.

BRIEF DESCRIPTION OF THE DRAWINGS

Exemplary embodiments disclosed herein may be more completely understood in consideration of the following detailed description in connection with the following figures. The figures are not necessarily drawn to scale. Like numbers used in the figures refer to like components. However, it will be understood that the use of a number to refer to a component in a given figure is not intended to limit the component in another figure labeled with the same number.

DETAILED DESCRIPTION

Figure 1:
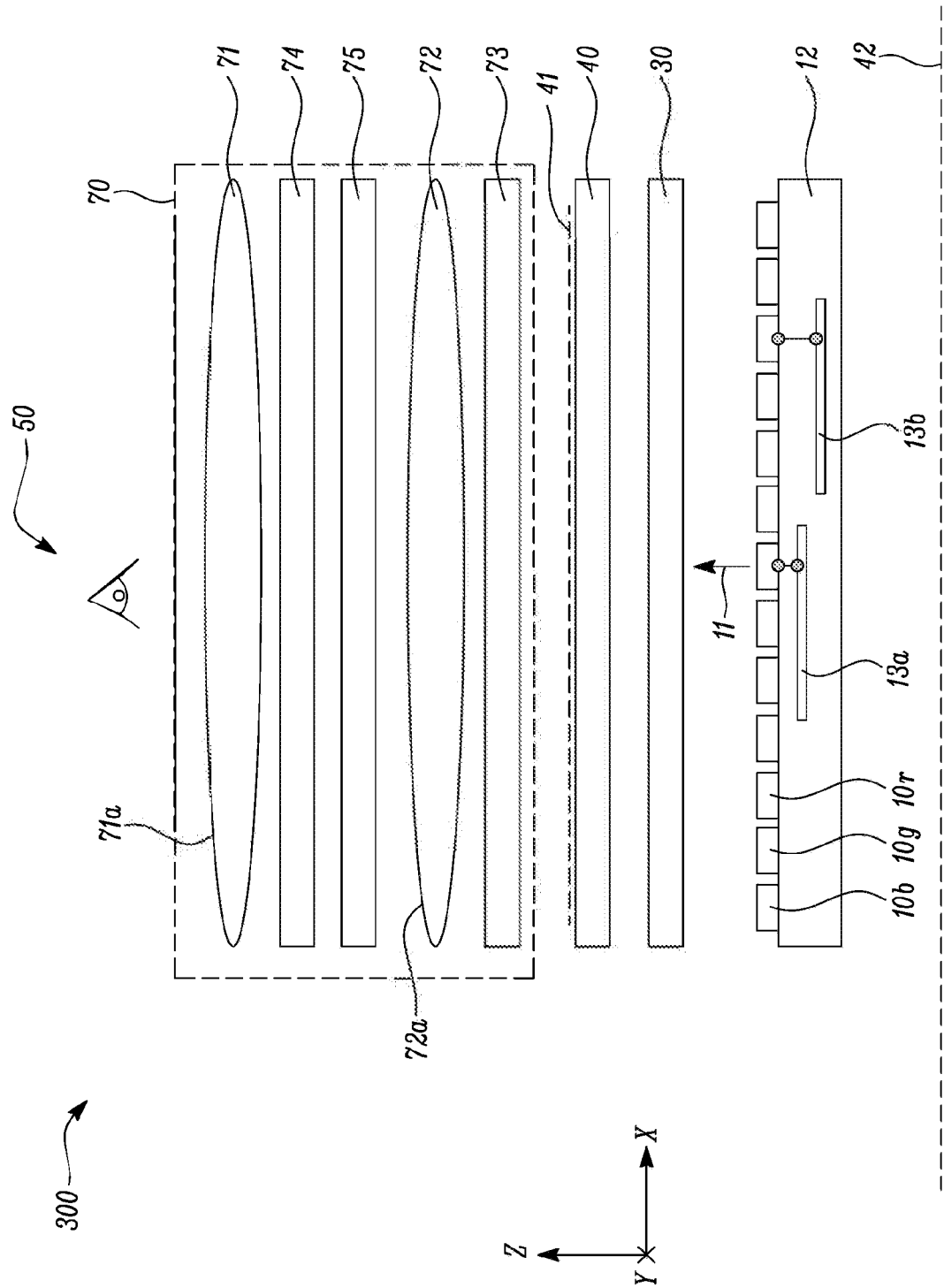
FIG. 1 illustrates a schematic view of a display, according to an embodiment of the present disclosure.

In the following description, reference is made to the accompanying figures that form a part thereof and in which various embodiments are shown by way of illustration. It is to be understood that other embodiments are contemplated and may be made without departing from the scope or spirit of the present disclosure. The following detailed description, therefore, is not to be taken in a limiting sense.

In the following disclosure, the following definitions are adopted.

As used herein, all numbers should be considered modified by the term "about". As used herein, "a," "an," "the," "at least one," and "one or more" are used interchangeably.

As used herein as a modifier to a property or attribute, the term "generally", unless otherwise specifically defined, means that the property or attribute would be readily recognizable by a person of ordinary skill but without requiring absolute precision or a perfect match (e.g., within +/−20% for quantifiable properties).

The term "substantially", unless otherwise specifically defined, means to a high degree of approximation (e.g., within +/−10% for quantifiable properties) but again without requiring absolute precision or a perfect match.

The term "about", unless otherwise specifically defined, means to a high degree of approximation (e.g., within +/−5% for quantifiable properties) but again without requiring absolute precision or a perfect match.

As used herein, the terms "first", "second" and "third" are used as identifiers. Therefore, such terms should not be construed as limiting of this disclosure. The terms "first", "second" and "third", when used in conjunction with a feature or an element can be interchanged throughout the embodiments of this disclosure.

As used herein, "at least one of A and B" should be understood to mean "only A, only B, or both A and B".

As used herein, the term "between about", unless otherwise specifically defined, generally refers to an inclusive or a closed range. For example, if a parameter X is between about A and B, then $A \leq X \leq B$.

As used herein, when a first material is termed as "similar" to a second material, at least 90 weight % of the first and second materials are identical and any variation between the first and second materials comprises less than about 10 weight % of each of the first and second materials.

As used herein, the term "film" generally refers to a material with a very high ratio of length or width to thickness. A film has two major surfaces defined by a length and width. Films typically have good flexibility and can be used for a wide variety of applications, including displays. Films may also be of thickness or material composition, such that they are semi-rigid or rigid. Films described in the present disclosure may be composed of various polymeric materials. Films may be monolayer, multilayer, or blend of different polymers.

As used herein, the term "layer" generally refers to a thickness of material within a film that has a relatively consistent chemical composition. Layers may be of any type of material including polymeric, cellulosic, metallic, or a blend thereof. A given polymeric layer may include a single polymer-type or a blend of polymers and may be accompanied by additives. A given layer may be combined or connected to other layers to form films. A layer may be either partially or fully continuous as compared to adjacent layers or the film. A given layer may be partially or fully coextensive with adjacent layers. A layer may contain sub-layers.

As used herein, the term "adhesive" generally refers to polymeric compositions useful to adhere together two adherends. Examples of adhesives may include curable adhesives, heat activated adhesives, pressure sensitive adhesives, or combinations thereof.

In some cases, displays and display systems may require collimating light control. Specifically, displays and display systems for VR/AR applications may require collimating light control to minimize stray lights and optical artifacts, such as ghost images. Such optical artifacts may negatively affect experience of a viewer and may reduce an optical performance of the displays and display systems.

The present disclosure relates to displays or display systems that may be used in virtual reality (VR) and augmented reality (AR) devices, such as, entertainment, industrial applications, gaming, healthcare, etc. In some embodiments, the display may be used in a head-mounted display (HMD). In some embodiments, the display may be worn on a head of a viewer or may be included as a part of a headgear (e.g., helmet), that has a small display optic in front of an eye, such as in a monocular display device, or two eyes, such as in a binocular display device.

The present disclosure provides a display. The display includes a plurality of blue, green, and red light emitting elements having respective blue, green, and red emission spectra including respective blue, green, and red emission peaks at respective blue, green, and red peak wavelengths with respective blue, green, and red full width at half maxima (FWHMs). The display further includes a display panel disposed on the plurality of blue, green, and red light emitting elements and configured to receive light emitted by the plurality of blue, green, and red light emitting elements and form an image. The display panel is configured to display a virtual image of the formed image to a viewer. The display further includes an optically collimating film disposed between, and substantially co-extensive in length and width with, the display panel and the plurality of blue, green, and red light emitting elements. The optically collimating film includes a plurality of microlayers numbering at least 10 in total. Each of the microlayers has an average thickness of less than about 500 nanometers (nm), such that for a substantially collimated incident light and for each of mutually orthogonal polarization states, an optical transmittance of the optically collimating film includes substantially distinct blue, green, and red transmission bands having respective blue, green, and red FWHMs that overlap at least 30% of the respective blue, green, and red FWHMs of the emission spectra at a first incident angle of less than about 10 degrees and overlap less than 15% of the respective blue, green, and red FWHMs of the emission spectra at a second incident angle of greater than about 30 degrees.

Therefore, for the substantially collimated incident light and for each of the mutually orthogonal polarization states, the optically collimating film may substantially transmit the substantially collimated incident light incident on the optically collimating film at the first incident angle (e.g., substantially on-axis incident light) to form the image. Further, for the substantially collimated incident light and for each of the mutually orthogonal polarization states, the optically collimating film may substantially block the substantially collimated incident light incident on the optically collimating film at the second incident angle (e.g., obliquely or off-axis incident light).

Hence, the optically collimating film may provide the collimation functionality that may be required to reduce or prevent optical artifacts, such as ghost images, and may further enhance the optical performance (e.g., brightness and/or contrast) of the display.

FIG. 1 illustrates a schematic view of a display 300, according to an embodiment of the present disclosure. In some embodiments, the display 300 may be used in AR and VR applications, without any limitations. The display 300 defines mutually orthogonal X, Y, and Z directions. The X, Y directions are the in-plane direction of the display 300, while the Z direction is a transverse direction along a thickness of the display 300. In other words, the X, Y directions are disposed along a plane of the display 300, while the Z direction is substantially perpendicular to the plane of the display 300.

The display 300 includes a plurality of blue, green, and red light emitting elements 10b, 10g, 10r. Further, the plurality of blue, green, and red light emitting elements 10b, 10g, 10r are configured to emit light 11 at least mostly within respective 420-480 nm, 490-560 nm, and 590-670 nm wavelength ranges. For example, referring to FIGS. 1 and 3, the light 11 includes a blue wavelength 22b within 420-480 nm, a green wavelength 22g within 490-560 nm, and a red wavelength 22r within 590-670 nm:

In some embodiments, each of at least some of the plurality of blue, green, and red light emitting elements 10b, 10g, 10r includes a light emitting diode (LED). In some embodiments, each of at least some of the plurality of blue, green, and red light emitting elements 10b, 10g, 10r includes an organic light emitting diode (OLED). In some embodiments, the plurality of blue, green, and red light emitting elements 10b, 10g, 10r, in combination, are configured to emit substantially white light. In some examples, the blue, green, and red light emitting elements 10b, 10g, 10r may be controlled in unison by a control circuitry (not shown) or may be individually controlled. In some other examples, the blue, green, and red light emitting elements 10b, 10g, 10r may include light emitting elements operating at different wavelengths in order to produce a white light output.

As illustrated in FIG. 1, in some embodiments, the plurality of blue, green, and red light emitting elements 10b, 10g, 10r form a regular array and are disposed on a substrate 12. In some embodiments, the substrate 12 is a printed circuit board including at least one printed electrically conductive trace 13a, 13b connected to at least one of the plurality of blue, green, and red light emitting elements 10b, 10g, 10r. In the illustrated embodiment of FIG. 1, the substrate 12 includes two electrically conductive traces 13a, 13b. In some embodiments, the substrate 12 includes a thin-film transistor (TFT) glass layer.

As shown in FIG. 1, the display 300 further includes a display panel 40 disposed on the plurality of blue, green, and red light emitting elements 10b, 10g, 10r. The display panel 40 is configured to receive the light 11 emitted by the plurality of blue, green, and red light emitting elements 10b, 10g, 10r and form an image 41. Further, the display panel 40 is configured to display a virtual image 42 of the formed image 41 to a viewer 50. The virtual image 42 may be interchangeably referred to as a magnified virtual image 42. Thus, the display 300 displays the magnified virtual image 42 of the image 41 formed by the display panel 40 to the viewer 50.

The display panel 40 may include an electronic display device that is used to display content, such as, still images, moving images, text, visual materials, and the like. The display panel 40 may include other types of display, such as, a liquid crystal display (LCD). In some examples, the display 300 is configured to display the virtual image 42 of the generated image 41 to an eye of the viewer 50 disposed within an eye box (not shown). The eye box may include a volume in which the pupil of the eye can be located in order to acceptably view the virtual image 42.

Further, the display 300 includes an optically collimating film 30 disposed between, and substantially co-extensive in length and width with, the display panel 40 and the plurality of blue, green, and red light emitting elements 10b, 10g, 10r. In some embodiments the length and the width may extend along the X and Y directions, respectively.

Figure 2:
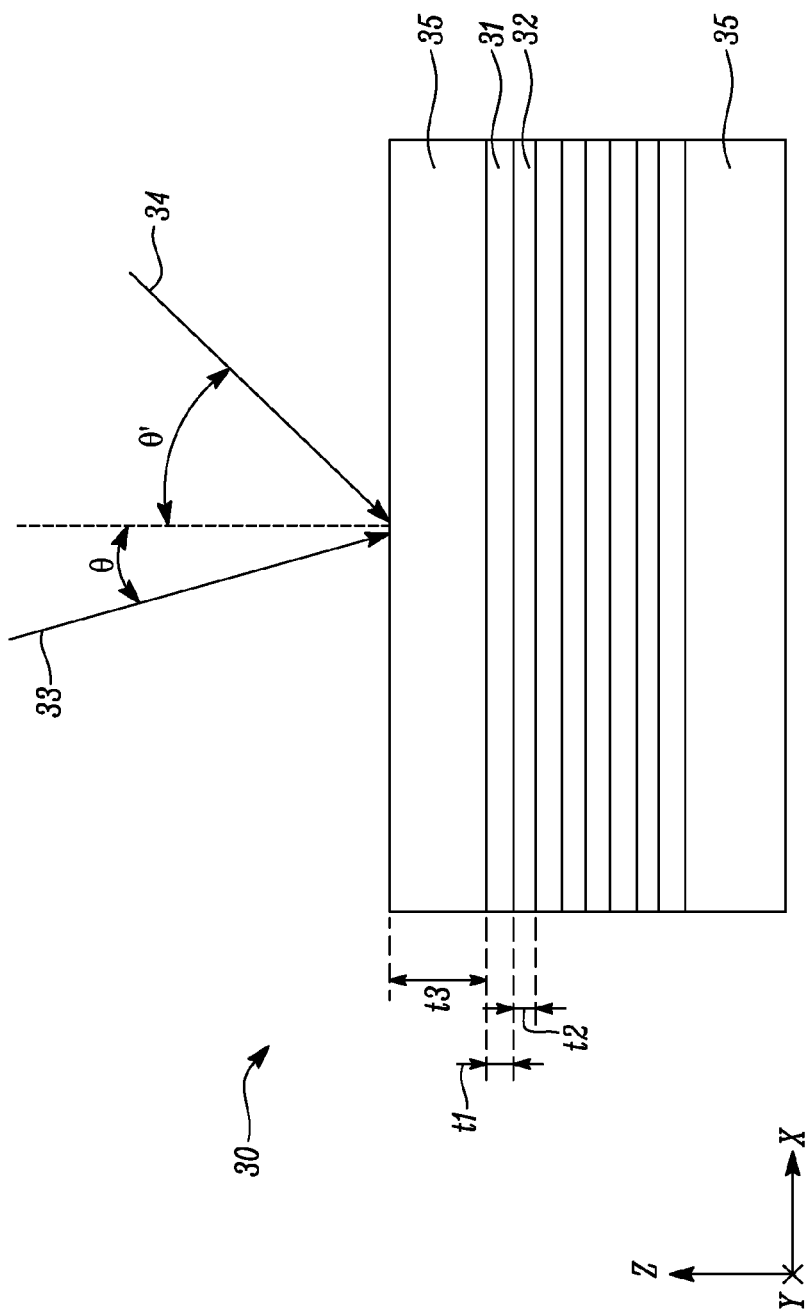
FIG. 2 illustrates a schematic sectional view of an optically collimating film, according to an embodiment of the present disclosure.

FIG. 2 illustrates a schematic sectional view of the optically collimating film 30, according to an embodiment of the present disclosure.

Referring to FIG. 2, the optically collimating film 30 includes a plurality of microlayers 31, 32 numbering at least 10 in total. In some embodiments, the plurality of microlayers 31, 32 number at least 20, at least 50, at least 100, at least 200, at least 300, at least 400, or at least 500 in total. Further, each of the microlayers 31, 32 has an average thickness of less than about 500 nm. In some embodiments, the average thickness of the microlayers 31, 32 may be less than about 400 nm, less than about 300 nm, or less than about 200 nm. In some embodiments, the plurality of microlayers 31, 32 of the optically collimating film 30 includes a plurality of alternating first and second microlayers 31, 32 having respective average thicknesses t1, t2. The term "average thickness", as used herein, refers to an average of thicknesses measured at multiple points across a plane (i.e., the x-y plane) of each of the first and second microlayers 31, 32.

In some examples, the plurality of microlayers 31, 32 may be disposed in a stacked configuration. In some embodiments, the plurality of microlayers 31, 32 of the optically collimating film 30 includes the plurality of alternating first and second microlayers 31, 32 having respective indices of refraction nx1, nx2 along a same in-plane first direction. In some embodiments, the first direction may extend along the X direction. In some embodiments, the index of refraction nx1 is greater than the index of refraction nx2 by at least 0.1 for at least one wavelength within 490-560 nm. In some embodiments, the index of refraction nx1 is greater than the index of refraction nx2 by at least 0.15, at least 0.2, or at least 0.25 for the at least one wavelength within 490-560 nm. In an example, the index of refraction nx1 may be about 1.846 for the at least one wavelength within 490-560 nm. In an example, the index of refraction nx2 may be about 1.570 for the at least one wavelength within 490-560 nm. Therefore, the index of refraction nx1 is greater than the index of refraction nx2 by 0.276 for the at least one wavelength within 490-560 nm.

Further, in some embodiments, the alternating first and second microlayers 31, 32 have respective indices of refraction ny1, ny2 along a same in-plane second direction orthogonal to the first in-plane direction. In some embodiments, the second direction may extend along the Y direction. In some embodiments, the index of refraction ny1 and the index of refraction ny2 are within 0.1 of each other for the at least one wavelength within 490-560 nm. In some embodiments, the index of refraction ny1 and the index of refraction ny2 are within 0.08, within 0.06, within 0.04, within 0.02, or within 0.01 of each other for the at least one wavelength within 490-560 nm. In an example, the index of refraction ny1 may be about 1.564 for the at least one wavelength within 490-560 nm. In an example, the index of refraction ny2 may be about 1.570 for the at least one wavelength within 490-560 nm. Therefore, the index of refraction ny1 and the index of refraction ny2 are within 0.006 of each other for the at least one wavelength within 490-560 nm.

Furthermore, in some embodiments, the alternating first and second microlayers 31, 32 have respective indices of refraction nz1, nz2 along a same third direction orthogonal to the first and second directions. In some embodiments, the third direction may extend along the Z direction. In some embodiments, the index of refraction nz1 and the index of refraction nz2 are within 0.1 of each other for the at least one wavelength within 490-560 nm. In some embodiments, the index of refraction nz1 and the index of refraction nz2 are within 0.08, within 0.06, within 0.04, within 0.02, or within 0.01 of each other for the at least one wavelength within 490-560 nm. In an example, the index of refraction nz1 may be about 1.559 for the at least one wavelength within 490-560 nm. In an example, the index of refraction nz2 may be about 1.570 for the at least one wavelength within 490-560 nm. Therefore, the index of refraction nz1 and the index of refraction nz2 are within 0.011 of each other for the at least one wavelength within 490-560 nm.

In some embodiments, the index of refraction nx1 is greater than each of the indices of refraction ny1, nz1 by at least 0.1. In some embodiments, the index of refraction nx1 is greater than each of the indices of refraction ny1, nz1 by at least 0.15, at least 0.2, or at least 0.25.

In some embodiments, the indices of refraction nx2, ny2, nz2 are within 0.1 of each other. In some embodiments, the indices of refraction nx2, ny2, and nz2 are within 0.08, within 0.06, within 0.04, within 0.02, or within 0.01 of each other.

In an embodiment, the index of refraction nx1 is about 1.846 and the index of refraction nx2 is about 1.570. In an embodiment, the index of refraction ny1 is about 1.564 and the index of refraction ny2 is about 1.570. In an embodiment, the index of refraction nz1 is about 1.559 and the index of refraction nz2 is about 1.570.

Therefore, the index of refraction nx1 is greater than the index of refraction ny1 by 0.282 and the index of refraction nx1 is greater than the index of refraction nz1 by 0.287. In other words, each of the first microlayers 31 includes a birefringent material. Further, the indices of refraction nx2, ny2, nz2 are substantially equal to each other. In other words, each of the second microlayers 32 includes an isotropic material.

In some embodiments, the optically collimating film 30 further includes at least one skin layer 35 having an average thickness t3 of greater than about 500 nm. In some embodiments, the average thickness t3 of the at least one skin layer 35 is greater than about 750 nm, greater than about 1000 nm, greater than about 1500 nm, or greater than about 2000 nm. In the illustrated embodiment of FIG. 2, the optically collimating film 30 includes two skin layers 35. The at least one skin layer 35 may protect the plurality of microlayers 31, 32, and may also provide mechanical stability to the optically collimating film 30. In some cases, the at least one skin layer 35 may act as protective boundary layer (PBL).

FIG. 2 further illustrates a substantially collimated incident light 33 incident on the optically collimating film 30 at a first incident angle θ and a substantially collimated incident light 34 incident on the optically collimating film 30 at a second incident angle θ'.

The first incident angle θ is less than about 10 degrees. In some embodiments, the first incident angle θ is less than about 8 degrees, less than about 6 degrees, less than about 4 degrees, less than about 3 degrees, less than about 2, or less than about 1 degree. In an embodiment, the first incident angle θ is about 0 degree.

The second incident angle θ' is greater than about 30 degrees. In some embodiments, the second incident angle θ' is greater than about 35 degrees, greater than about 40 degrees, greater than about 45 degrees, greater than about 50 degrees, greater than about 55 degrees, or greater than about 60 degrees. In some embodiments, the second incident angle θ' is less than about 60 degrees and greater than about 30 degrees. In some embodiments, the second incident angle θ' is less than about 55 degrees or less than about 50 degrees, and greater than about 30 degrees. In an embodiment, the second incident angle θ' is about 45 degrees.

Figure 3:
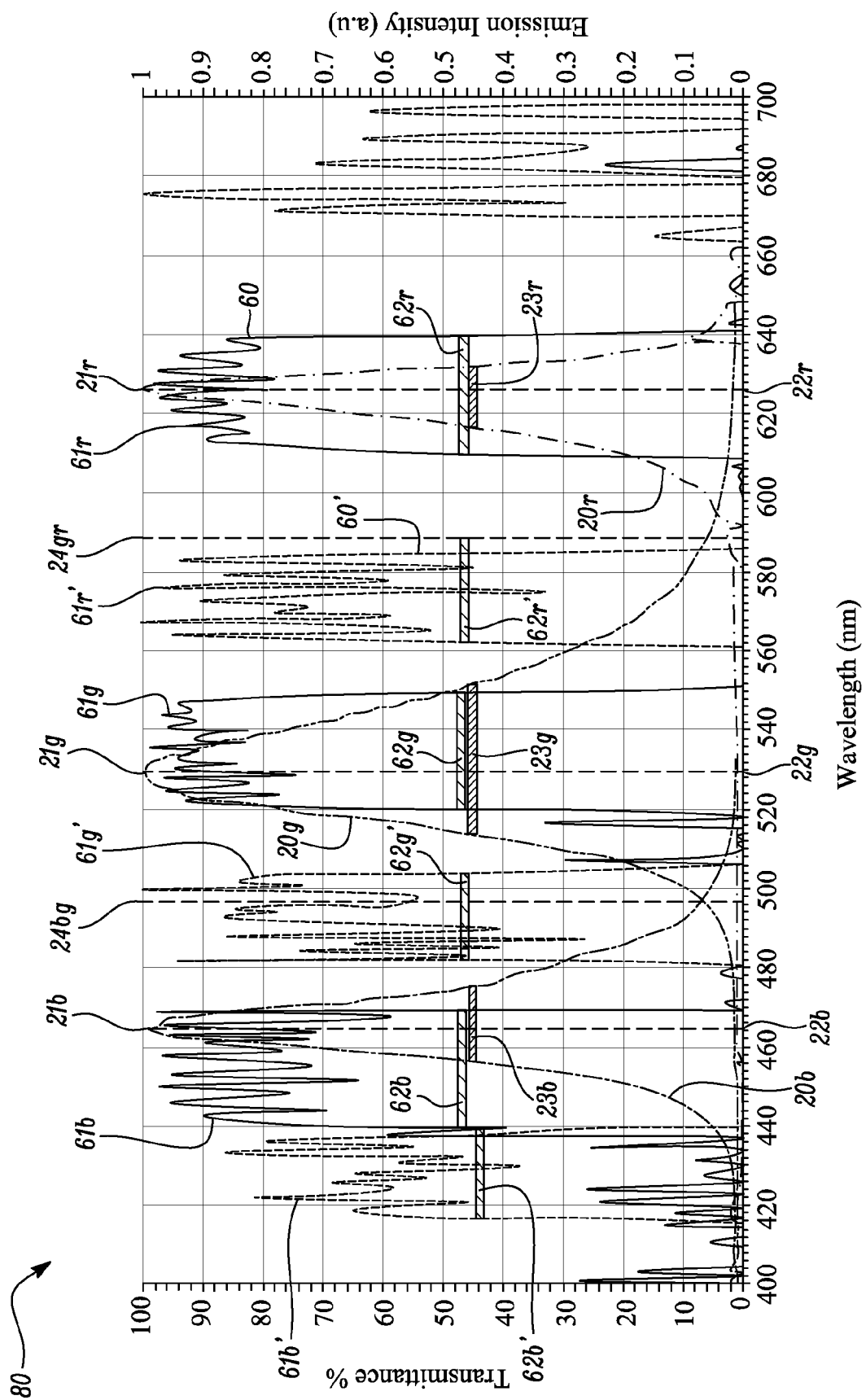
FIG. 3 illustrates a graph depicting optical transmittance versus wavelength of the optically collimating film and emission intensity versus wavelength of blue, green, and red light emitting elements of the display, according to an embodiment of the present disclosure.

FIG. 3 illustrates a graph 80 depicting optical transmittance versus wavelength of the optically collimating film 30 (shown in FIG. 2), according to an embodiment of the present disclosure. Specifically, the graph 80 depicts the optical transmittance versus wavelength of the optically collimating film 30 for the substantially collimated incident lights 33, 34 and incident on the optically collimating film 30 at the respective first and second incident angles θ, θ' (shown in FIG. 2). The graph 80 further depicts emission intensity versus wavelength of the blue, green, and red light emitting elements 10b, 10g, 10r (shown in FIG. 1). Wavelength is expressed in nanometers (nm) in abscissa. The optical transmittance is expressed as a transmittance percentage in the left ordinate, while the emission intensity is expressed in arbitrary units (a.u.) in the right ordinate. The emission intensity in arbitrary units corresponds to blue, green, and red emission spectra 20b, 20g, 20r of the plurality of blue, green, and red light emitting elements 10b, 10g, 10r, respectively.

Referring to FIGS. 1 to 3, the plurality of blue, green, and red light emitting elements 10b, 10g, 10r have the respective blue, green, and red emission spectra 20b, 20g, 20r. The blue, green, and red emission spectra 20b, 20g, 20r include respective blue, green, and red emission peaks 21b, 21g, 21r at respective blue, green, and red peak wavelengths with respective blue, green, and red FWHMs 23b, 23g, 23r.

In the illustrated embodiment of FIG. 3, the blue wavelength 22b may be interchangeably referred to as the blue peak wavelength 22b, the green wavelength 22g may be interchangeably referred to as the green peak wavelength 22g, and the red wavelength 22r may be interchangeably referred to as the red peak wavelength 22r.

For the substantially collimated incident light 33, 34 and for each of mutually orthogonal polarization states, an optical transmittance 60, 60' of the optically collimating film 30 includes substantially distinct blue, green, and red transmission bands 61b, 61b', 61g, 61g', 61r, 61r' having respective blue, green, and red FWHMs 62b, 62b', 62g, 62g', 62r, 62r'.

Specifically, for the substantially collimated incident light 33 incident on the optically collimating film 30 at the first incident angle θ and for each of the mutually orthogonal polarization states, the optical transmittance 60 of the optically collimating film 30 includes the blue, green, and red transmission bands 61b, 61g, 61r having the respective blue, green, and red FWHMs 62b, 62g, 62r. Further, for the substantially collimated incident light 34 incident on the optically collimating film 30 at the second incident angle θ' and for each of the mutually orthogonal polarization states, the optical transmittance 60' of the optically collimating film 30 includes the blue, green, and red transmission bands 61b', 61g', 61r' having the respective blue, green, and red FWHMs 62b', 62g', 62r'.

For the substantially collimated incident light 33 and for each of the mutually orthogonal polarization states, the optical transmittance 60 of the optically collimating film 30 includes the blue, green, and red transmission bands 61b, 61g, 61r having the respective blue, green, and red FWHMs 62b, 62g, 62r that overlap at least 30% of the respective blue, green and red FWHMs 23b, 23g, 23r of the emission spectra 20b, 20g, 20r at the first incident angle θ. In some embodiments, for the substantially collimated incident light 33 and for each of the mutually orthogonal polarization states, the optical transmittance 60 of the optically collimating film 30 includes the blue, green, and red transmission bands 61b, 61g, 61r having the respective blue, green, and red FWHMs 62b, 62g, 62r that overlap at least 40%, at least 50%, at least 60%, at least 70%, at least 80%, at least 90%, or at least 100% of the respective blue, green and red FWHMs 23b, 23g, 23r of the emission spectra 20b, 20g, 20r at the first incident angle θ.

Further, for the substantially collimated incident light 34 and for each of the mutually orthogonal polarization states, the optical transmittance 60' of the optically collimating film 30 includes the blue, green, and red transmission bands 61b', 61g', 61r' having the respective blue, green, and red FWHMs 62b', 62g', 62r' that overlap less than 15% of the respective blue, green and red FWHMs 23b, 23g, 23r of the emission spectra 20b, 20g, 20r at the second incident angle θ'. In some embodiments, for the substantially collimated incident light 34 and for each of the mutually orthogonal polarization states, the optical transmittance 60' of the optically collimating film 30 includes the substantially distinct blue, green, and red transmission bands 61b', 61g', 61r' having the respective blue, green, and red FWHMs 62b', 62g', 62r' that overlap less than 10%, less than 5%, less than 4%, less than 3%, less than 2%, or less than 1% of the respective blue, green, and red FWHMs 23b, 23g, 23r of the emission spectra 20b, 20g, 20r at the second incident angle θ'.

Referring to FIGS. 1 and 3, for each of the blue, green, and red wavelengths 22b, 22g, 22r, and for each of the first and second in-plane directions, the optically collimating film 30 transmits at least 50% of the incident light for the first incident angle θ, and transmits less than about 10% of the incident light for the second incident angle θ'. In some embodiments, for each of the blue, green, and red wavelengths 22b, 22g, 22r, and for each of the first and second in-plane directions, the optically collimating film 30 transmits at least 55%, at least 60%, at least 65%, at least 70%, at least 80%, at least 85%, or at least 90% of the incident light for the first incident angle θ and transmits less than about 8%, less than about 6%, less than about 4%, less than about 2%, less than about 1%, less than about 0.5%, less than about 0.25%, or less than about 0.1% of the incident light for the second incident angle θ'.

Therefore, for the substantially collimated incident light 33 and for each of the mutually orthogonal polarization states, the optically collimating film 30 may substantially transmit the substantially collimated incident light 33 emitted by the plurality of blue, green, and red light emitting elements 10b, 10g, 10r and incident on the optically collimating film 30 at the first incident angle θ (e.g., substantially on-axis incident light) to form the image 41.

Further, for the substantially collimated incident 34 light and for each of the mutually orthogonal polarization states, the optically collimating film 30 may substantially block the substantially collimated incident light 34 incident on the optically collimating film 30 at the second incident angle θ' (e.g., obliquely or off-axis incident light).

Hence, the optically collimating film 30 may provide the collimation functionality that may be required to reduce or prevent optical artifacts, such as ghost images, and may further enhance the optical performance (e.g., brightness and/or contrast) of the display 300.

In some embodiments, for each of at least one blue-green wavelength 24bg disposed between the blue and green FWHMs 23b, 23g of the emission spectra 20b, 20g and at least one green-red wavelength 24gr disposed between the green and red FWHMs 23g, 23r of the emission spectra 20g, 20r, and for the first incident angle θ, the optically collimating film 30 has an optical transmittance of less than about 10%. In some embodiments, for each of the at least one blue-green wavelength 24bg disposed between the blue and green FWHMs 23b, 23g of the emission spectra 20b, 20g and the at least one green-red wavelength 24gr disposed between the green and red FWHMs 23g, 23r of the emission spectra 20g, 20r, and for the first incident angle θ, the optically collimating film 30 has the optical transmittance of less than about 8%, less than about 6%, less than about 4%, less than about 2%, less than about 1%, less than about 0.5%, less than about 0.25%, or less than about 0.1%.

In some embodiments, the optically collimating film 30 has an optical absorption of greater than about 1% at at least one of the blue, green, and red peak wavelengths 22b, 22g, 22r. In some embodiments, the optically collimating film 30 has the optical absorption of greater than about 2%, greater than about 5%, or greater than about 10% at the at least one of the blue, green, and red peak wavelengths 22b, 22g, 22r. Further, in some embodiments, the optical absorption of the greater than about 1% is by virtue of the optically collimating film 30 including an optically absorbing material. In some embodiments, the optically absorbing material includes carbon black.

Referring again to FIG. 1, the display 300 further includes a lens assembly 70 disposed on the display panel 40 opposite the optically collimating film 30. In some embodiments, the lens assembly 70 includes at least one of a lens 71, 72, a partial reflector 73, and a reflective polarizer 74. In some embodiments, the lens assembly 70 is configured to form the magnified virtual image 42 of the image 41 formed by the display panel 40.

In the illustrated embodiment of FIG. 1, the lens assembly 70 includes at least one lens 71, 72 having at least one curved major surface 71a, 72a, the partial reflector 73, and the reflective polarizer 74. The lens assembly 70 is disposed between the display panel 40 and the viewer 50. In the illustrated embodiment of FIG. 1, the lens assembly 70 includes two lenses 71, 72 having curved major surfaces 71a, 72a, respectively. In some examples, the lens 71 and the lens 72 may be substantially similar. In some examples, the lens 71 and the lens 72 may be different. In some examples, the lenses 71, 72 may include a Fresnel lens. In some examples, the lenses 71, 72 may include a planar lens, a concave lens, or a convex lens. In some examples, the lenses 71, 72 may include a biconvex lens. In some examples, the lenses 71, 72 may include suitable materials, such as, glass, polymethyl methacrylate (PMMA), polycarbonate, and the like.

In some embodiments, the lens assembly 70 includes the partial reflector 73, such that for a substantially normally incident light and for each of the mutually orthogonal polarization states, the partial reflector 73 reflects at least 30% of the incident light and transmits at least 30% of the incident light. In some embodiments, for the substantially normally incident light and for each of the mutually orthogonal polarization states, the partial reflector 73 reflects at least 35%, at least 40%, or at least 45% of the incident light and transmits at least 35%, at least 40%, or at least 45% of the incident light.

Referring to FIGS. 1 and 3, for each of the first and second incident angles θ, θ', for each of the blue, green, and red wavelengths 22b, 22g, 22r, and for each of the first and second in-plane directions, the partial reflector 73 reflects at least 30% of the incident light and transmits at least 30% of the incident light. In some embodiments, for each of the first and second incident angles θ, θ', for each of the blue, green, and red wavelengths 22b, 22g, 22r, and for each of the first and second in-plane directions, the partial reflector 73 reflects at least 35%, at least 40%, or at least 45% of the incident light and transmits at least 35%, at least 40%, or at least 45% of the incident light.

In some embodiments, the partial reflector 73 includes a metal. In some examples, the partial reflector 73 may include one or more elements, such as silver, aluminum, a non-conductive coating, etc.

In some embodiments, the lens assembly 70 further includes the reflective polarizer 74, such that for a substantially normally incident light, the reflective polarizer 74 reflects at least 60% of the incident light polarized along the first in-plane direction and transmits at least 60% of the incident light polarized along the orthogonal second in-plane direction. In some embodiments, the reflective polarizer 74 reflects at least 55%, at least 70%, at least 75%, at least 80%, at least 85%, or at least 90% of the incident light polarized along the first in-plane direction and transmits at least 55%, at least 70%, at least 75%, at least 80%, at least 85%, or at least 90% of the incident light polarized along the orthogonal second in-plane direction.

Referring to FIGS. 1 and 3, for each of the first and second incident angles θ, θ', and for each of the blue, green, and red wavelengths 22b, 22g, 22r, the reflective polarizer 74 reflects at least 60% of the incident light polarized along the first in-plane direction and transmits at least 60% of the incident light polarized along the orthogonal second in-plane direction. In some embodiments, the reflective polarizer 74 reflects at least 65%, at least 70%, at least 75%, at least 80%, at least 85%, or at least 90% of the incident light polarized along the first in-plane direction and transmits at least 65%, at least 70%, at least 75%, at least 80%, at least 85%, or at least 90% of the incident light polarized along the orthogonal second in-plane direction.

In some examples, the reflective polarizer 74 may include an Advanced Polarizing Film (APF) available from 3M Company, St. Paul, MN. However, the reflective polarizer 74 may be any suitable reflective polarizer. In some examples, the reflective polarizer 74 may include one or more of a multilayer polymeric reflective polarizer, a wire grid reflective polarizer, and a diffuse reflective polarizer. In some examples, light passing through the lens assembly 70 is reflected at least once by each of the partial reflector 73 and the reflective polarizer 74.

As shown in FIG. 1, in some embodiments, the lens assembly 70 further includes a retarder layer 75 configured to change a phase of an incident polarized light ray by at least 20 degrees upon transmission. In some embodiments, the retarder layer 75 is configured to change the phase of the incident polarized light ray by at least 25 degrees, at least 30 degrees, at least 35 degrees, at least 40 degrees, or at least 45 degrees upon transmission. In the illustrated embodiment of FIG. 1, the retarder layer 75 is disposed between the lens 72 and the reflective polarizer 74. In an example, the retarder layer 75 may include a birefringent material. The birefringent material may include quartz, mica, plastic, and the like.

In some embodiments, adjacent components of the lens assembly 70 are laminated to each other. In some embodiments, adjacent components of the lens assembly 70 are bonded to each other via an optically clear adhesive layer or an epoxy layer. In some embodiments, adjacent components of the lens assembly 70 may include an air gap therebetween. For example, the reflective polarizer 74 and the lens 71 may be laminated to each other, the reflective polarizer 74 and the retarder layer 75 may include an air gap therebetween, the retarder layer 75 and the lens 72 may be bonded to each other, and the partial reflector 73 may be coated on the lens 72.

Figure 4:
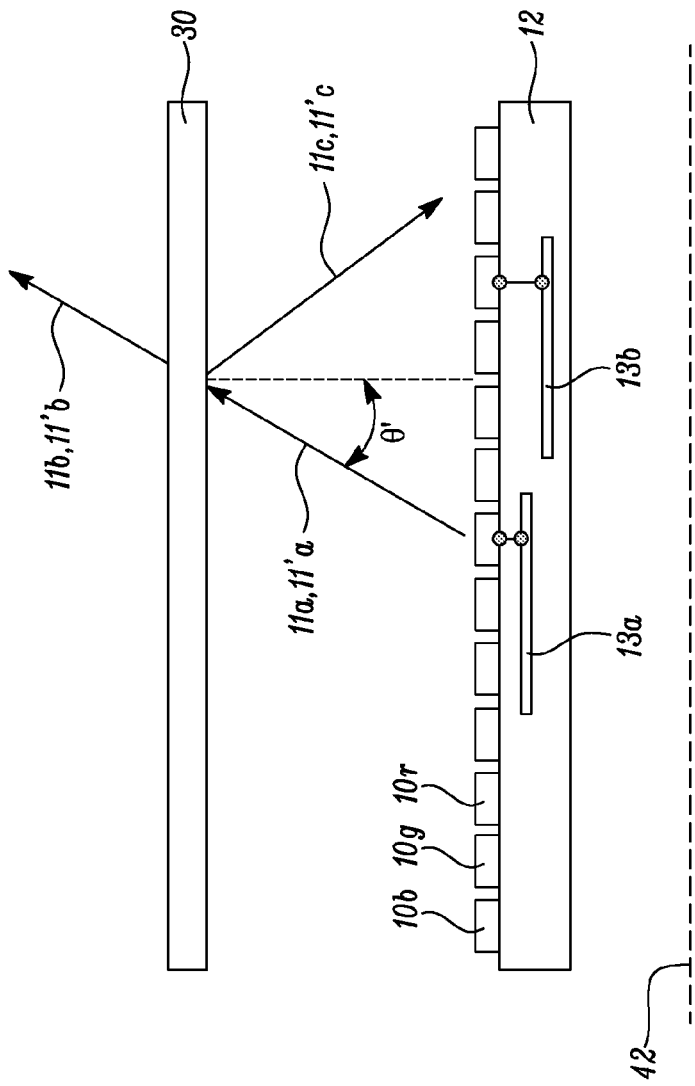
FIG. 4 illustrates a schematic view of the plurality of blue, green, and red light emitting elements configured to emit light and the optically collimating film disposed on the plurality of blue, green and red light emitting elements, according to an embodiment of the present disclosure.

FIG. 4 illustrates a schematic view of the plurality of blue, green, and red light emitting elements 10b, 10g, 10r configured to emit light and the optically collimating film 30 disposed on the plurality of blue, green and red light emitting elements 10b, 10g, 10r. In the illustrated embodiment of FIG. 4, the emitted light is denoted as an incident light 11a, 11'a, a reflected light is denoted as the reflected light 11c, 11'c, and a transmitted light is denoted by the transmitted light 11b, 11'b.

Referring to FIGS. 1-4, in some embodiments, for each of the blue, green, and red wavelengths 22b, 22g, 22r, and for each of the first and second in-plane directions, the optically collimating film 30 reflects more than about 60% of the incident light 11a that is not transmitted at the second incident angle θ'. In some embodiments, for each of the blue, green, and red wavelengths 22b, 22g, 22r, and for each of the first and second in-plane directions, the optically collimating film 30 reflects more than about 70%, more than about 80%, more than about 90%, more than about 95%, more than about 98%, or more than about 99% of the incident light 11a that is not transmitted at the second incident angle θ'.

In some embodiments, the display 300 is configured to prevent at least 60% of the reflected light 11*c* from exiting the display 300 toward the viewer 50. In some embodiments, the display 300 is configured to prevent at least 70%, at least 80%, at least 90%, or at least 95% of the reflected light 11*c* from exiting the display 300 toward the viewer 50. In some embodiments, at least 60% of the reflected light 11*c* that is prevented from exiting the display 300 toward the viewer 50 is absorbed. In some embodiments, at least 70%, at least 80%, at least 90%, at least 95% of the reflected light 11*c* that is prevented from exiting the display 300 toward the viewer 50 is absorbed.

Figure 5:
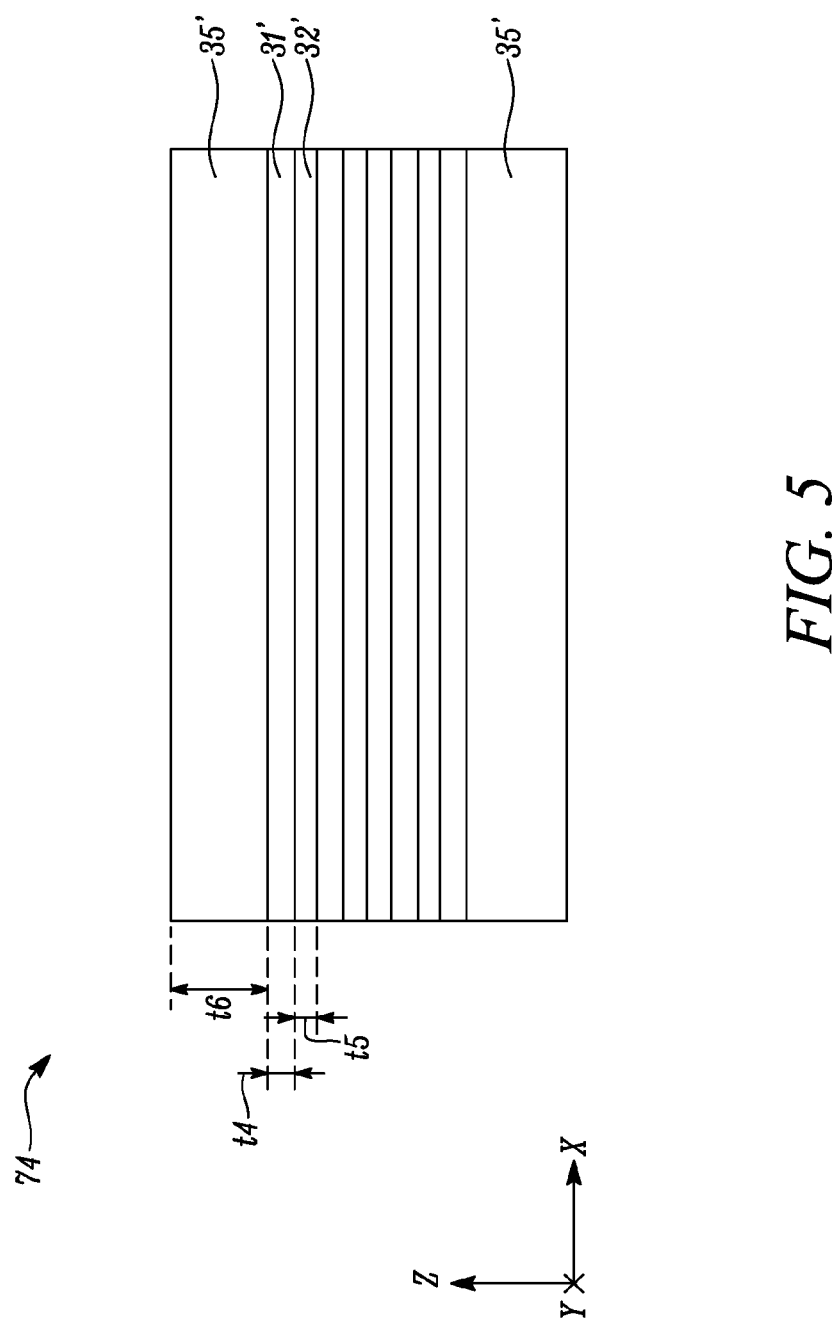
FIG. 5 illustrates a schematic sectional view of a reflective polarizer, according to an embodiment of the present disclosure.

FIG. 5 illustrates a schematic sectional view of the reflective polarizer 74, according to an embodiment of the present disclosure.

As shown in FIG. 5, the reflective polarizer 74 includes a plurality of microlayers 31', 32' numbering at least 10 in total. In some embodiments, the plurality of microlayers 31', 32' numbers at least 20, at least 50, at least 100, at least 200, at least 300, at least 400, or at least 500 in total. Further, each of the microlayers 31', 32' has an average thickness t4, t5 of less than about 500 nm. Moreover, in some embodiments, the average thickness t4, t5 of the microlayers 31', 32' may be less than about 400 nm, less than about 300 nm, or less than about 200 nm. In some examples, the plurality of microlayers 31', 32' may be disposed in a stacked configuration. In some embodiments, the plurality of microlayers 31', 32' of the reflective polarizer 74 includes a plurality of alternating first and second microlayers 31', 32' having respective average thicknesses t4, t5. In some embodiments, one of the microlayers 31', 32' includes a material with a high refractive index relative to the other. In some embodiments, at least one of the microlayers 31', 32' includes a birefringent material. In some embodiments, the reflective polarizer 74 may further include at least one intermediate layer (not shown). In some embodiments, the intermediate layer may include a material with a low refractive index.

In some embodiments, the reflective polarizer 74 further includes at least one skin layer 35' disposed on the plurality of microlayers 31', 32' thereof. The at least one skin layer 35' may protect the plurality of microlayers 31', 32', and may also provide mechanical stability to the reflective polarizer 74. In some cases, the at least one skin layer 35' may act as protective boundary layer (PBL). In some embodiments, the at least one skin layer 35' has an average thickness t6 of greater than about 500 nm. In the illustrated embodiment of FIG. 5, the reflective polarizer 74 includes two skin layers 35'.

Figure 6:
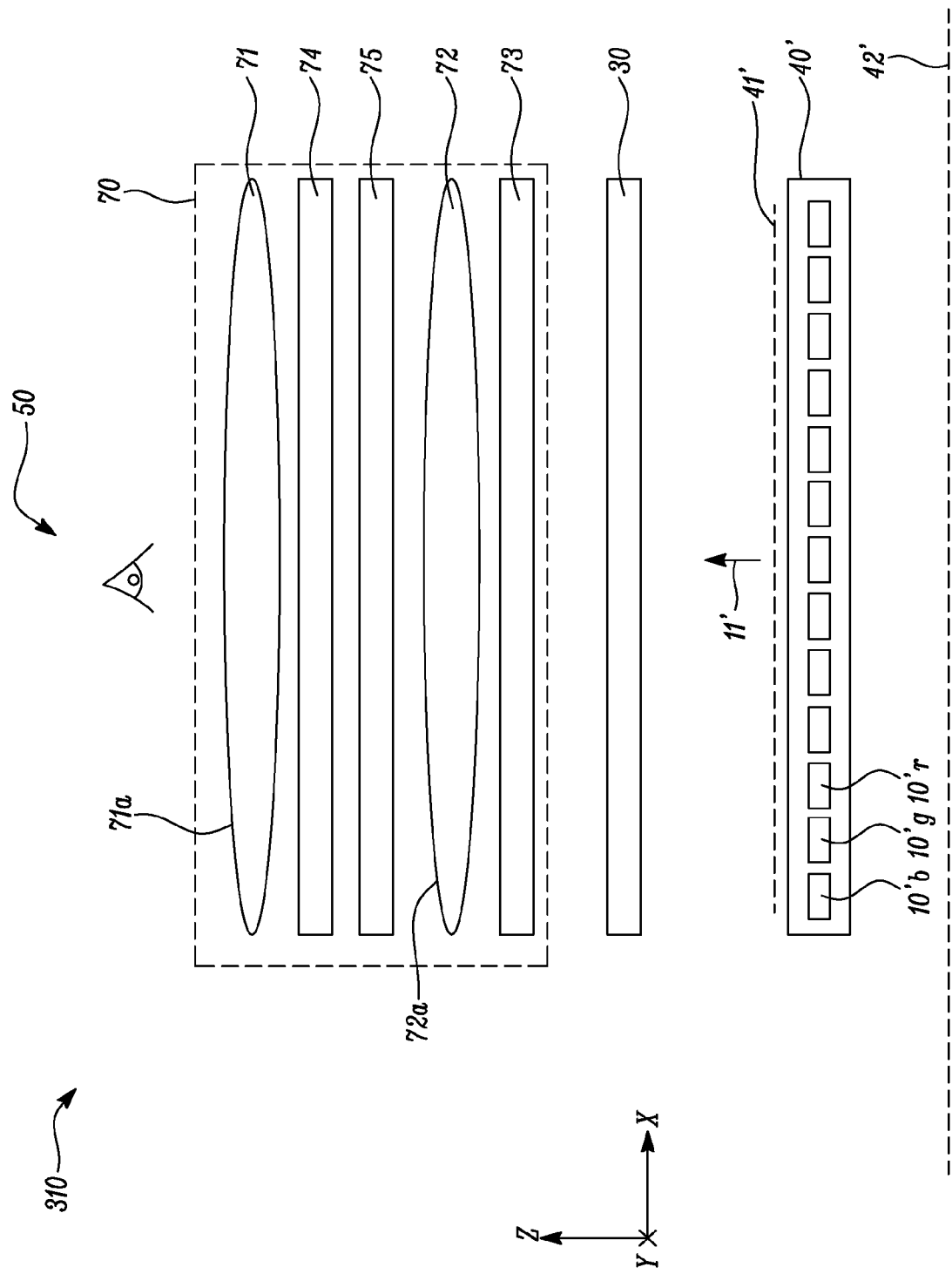
FIG. 6 illustrates a schematic view of a display system, according to another embodiment of the present disclosure.

FIG. 6 illustrates a schematic view of a display system 310 for displaying a magnified virtual image 42' of an image 41' formed by a pixelated display 40' to the viewer 50, according to another embodiment of the present disclosure.

The display system 310 includes the pixelated display 40' configured to form the image 41'. The pixelated display 40' includes a plurality of blue, green, and red light emitting pixels 10'*b*, 10'*g*, 10'*r* configured to emit light 11' at least mostly within respective 420-480 nm, 490-560 nm, and 590-670 nm wavelength ranges. In some embodiments, the term "at least mostly" includes at least 60%. In some embodiments, at least mostly includes at least 70%, at least 80%, or at least 90%.

The pixelated display 40' and the plurality of blue, green, and red light emitting pixels 10'*b*, 10'*g*, 10'*r* may be substantially similar to the display 300 and the plurality of blue, green, and red light emitting elements 10*b*, 10*g*, 10*r* illustrated and described in reference to FIG. 1. In some embodiments, each of the blue, green, and red light emitting pixels 10'*b*, 10'*g*, 10'*r* includes a micro-light emitting diode (micro-LED). In some embodiments, at least some of the micro-LEDs are organic micro-LEDs.

The display system 310 further includes the lens assembly 70. The lens assembly 70 is configured to form the magnified virtual image 42' of the image 41' formed by the pixelated display 40'. The details associated with the lens assembly 70 as explained in reference to FIGS. 1 and 2 are equally applicable to the lens assembly 70 of FIG. 6. The display system 310 further includes the optically collimating film 30 disposed between the lens assembly 70 and the pixelated display 40'.

Referring to FIGS. 4 and 6, in some embodiments, for each of the blue, green, and red wavelengths 22*b*, 22*g*, 22*r*, and for each of the first and second in-plane directions, the optically collimating film 30 transmits at least 50% of the incident light 11'*a* of the incident light for the first incident angle θ, and transmits less than about 10% of the incident light 11'*a* for the second incident angle θ'. In some embodiments, the display system 310 is configured to prevent at least 60% of the reflected light 11'*c* from exiting the display system 310 toward the viewer 50.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A display comprising:
   a plurality of blue, green, and red light emitting elements having respective blue, green, and red emission spectra comprising respective blue, green, and red emission peaks at respective blue, green, and red peak wavelengths with respective blue, green, and red full width at half maxima (FWHMs);
   a display panel disposed on the plurality of blue, green, and red light emitting elements and configured to receive light emitted by the plurality of blue, green, and red light emitting elements and form an image, the display panel configured to display a virtual image of the formed image to a viewer; and
   an optically collimating film disposed between, and substantially co-extensive in length and width with, the display panel and the plurality of blue, green, and red light emitting elements, the optically collimating film comprising a plurality of microlayers numbering at least 10 in total, each of the microlayers having an average thickness of less than about 500 nm, such that for a substantially collimated incident light and for each of mutually orthogonal polarization states, an optical transmittance of the optically collimating film comprises substantially distinct blue, green, and red transmission bands having respective blue, green, and red FWHMs that:
   overlap at least 30% of the respective blue, green, and red FWHMs of the emission spectra at a first incident angle of less than about 10 degrees; and
   overlap less than 15% of the respective blue, green, and red FWHMs of the emission spectra at a second incident angle of greater than about 30 degrees.

2. The display of claim 1, wherein the second incident angle is less than about 60 degrees.

3. The display of claim 1, wherein for each of at least one blue-green wavelength disposed between the blue and green FWHMs of the emission spectra and at least one green-red wavelength disposed between the green and red FWHMs of the emission spectra, and for the first incident angle, the optically collimating film has an optical transmittance of less than about 10%.

4. The display of claim 1 further comprising a lens assembly disposed on the display panel opposite the optically collimating film and comprising at least one of a lens, a partial reflector, and a reflective polarizer.

5. The display of claim 4, wherein the lens assembly comprises at least one lens.

6. The display of claim 4, wherein the lens assembly comprises a partial reflector, such that for a substantially normally incident light and for each of the mutually orthogonal polarization states, the partial reflector reflects at least 30% of the incident light and transmits at least 30% of the incident light.

7. The display of claim 4, wherein the lens assembly comprises a reflective polarizer, such that for a substantially normally incident light, the reflective polarizer reflects at least 60% of the incident light polarized along a first in-plane direction and transmits at least 60% of the incident light polarized along an orthogonal second in-plane direction.

8. The display of claim 1, wherein the plurality of microlayers of the optically collimating film comprises a plurality of alternating first and second microlayers having respective indices of refraction nx1 and nx2 along a same in-plane first direction, nx1 greater than nx2 by at least 0.1 for at least one wavelength within 490-560 nm.

9. The display of claim 1, wherein each of at least some of the plurality of blue, green, and red light emitting elements comprises an organic light emitting diode (OLED).

10. A display for displaying a magnified virtual image of an image formed by a display panel to a viewer, the display comprising:
   a plurality of blue, green, and red light emitting elements configured to emit light at least mostly within respective 420-480 nm, 490-560 nm, and 590-670 nm wavelength ranges;
   a display panel configured to receive light emitted by the plurality of blue, green, and red light emitting elements and form the image;
   a lens assembly configured to form the magnified virtual image of the image formed by the display panel and comprising at least one lens comprising at least one curved major surface, a partial reflector, and a reflective polarizer; and
   an optically collimating film, such that for a substantially collimated incident light, a first incident angle of less than about 10 degrees, a second incident angle of greater than about 30 degrees, a blue wavelength within 420-480 nm, a green wavelength within 490-560 nm, and a red wavelength within 590-670 nm:
      for each of the first and second incident angles, and for each of the blue, green, and red wavelengths, the reflective polarizer reflects at least 60% of the incident light polarized along a first in-plane direction and transmits at least 60% of the incident light polarized along an orthogonal second in-plane direction;
      for each of the first and second incident angles, for each of the blue, green, and red wavelengths, and for each of the first and second in-plane directions, the partial reflector reflects at least 30% of the incident light and transmits at least 30% of the incident light; and
      for each of the blue, green, and red wavelengths, and for each of the first and second in-plane directions, the optically collimating film transmits at least 50% of the incident light for the first incident angle, and transmits less than about 10% of the incident light for the second incident angle.

11. The display of claim 10, wherein the optically collimating film comprises a plurality of microlayers numbering at least 10 in total, each of the microlayers having an average thickness of less than about 500 nm.

12. The display of claim 10, wherein the plurality of blue, green, and red light emitting elements, in combination, are configured to emit substantially white light.

13. The display of claim 10, wherein for each of the blue, green, and red wavelengths, and for each of the first and second in-plane directions, the optically collimating film reflects more than about 60% of the incident light that is not transmitted at the second incident angle.

14. A display system for displaying a magnified virtual image of an image formed by a pixelated display to a viewer, the display system comprising:
   a pixelated display configured to form the image and comprising a plurality of blue, green, and red light emitting pixels configured to emit light at least mostly within respective 420-480 nm, 490-560 nm, and 590-670 nm wavelength ranges;
   a lens assembly configured to form the magnified virtual image of the image formed by the pixelated display and comprising at least one lens comprising at least one curved major surface, a partial reflector, and a reflective polarizer; and
   an optically collimating film disposed between the lens assembly and the pixelated display, such that for a substantially collimated incident light, a first incident angle of less than about 10 degrees, a second incident angle of greater than about 30 degrees, a blue wavelength within 420-480 nm, a green wavelength within 490-560 nm, and a red wavelength within 590-670 nm:
      for each of the first and second incident angles, and for each of the blue, green, and red wavelengths, the reflective polarizer reflects at least 60% of the incident light polarized along a first in-plane direction and transmits at least 60% of the incident light polarized along an orthogonal second in-plane direction;
      for each of the first and second incident angles, for each of the blue, green, and red wavelengths, and for each of the first and second in-plane directions, the partial reflector reflects at least 30% of the incident light and transmits at least 30% of the incident light; and
      for each of the blue, green, and red wavelengths, and for each of the first and second in-plane directions, the optically collimating film transmits at least 50% of the incident light for the first incident angle, and transmits less than about 10% of the incident light for the second incident angle.

15. The display system of claim 14, wherein each of the plurality of blue, green, and red light emitting pixels comprises a micro-light emitting diode (micro-LED).

* * * * *